United States Patent
Shigemori et al.

(10) Patent No.: US 8,216,750 B2
(45) Date of Patent: Jul. 10, 2012

(54) COLORED COMPOSITION, COLOR FILTER AND MANUFACTURING METHOD THEREOF

(75) Inventors: Isao Shigemori, Tokyo (JP); Morihide Miyamura, Tokyo (JP); Toshio Waku, Tokyo (JP); Yusuke Iida, Tokyo (JP); Kenro Sunahara, Tokyo (JP); Kohei Matsui, Tokyo (JP); Takeshi Ikeda, Tokyo (JP); Hideyo Tanaka, Tokyo (JP); Eishi Aoki, Tokyo (JP); Genki Harada, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 439 days.

(21) Appl. No.: 12/458,383

(22) Filed: Jul. 9, 2009

(65) Prior Publication Data

US 2009/0311479 A1 Dec. 17, 2009

Related U.S. Application Data

(63) Continuation of application No. PCT/JP2008/050276, filed on Jan. 11, 2008.

(30) Foreign Application Priority Data

Jan. 12, 2007 (JP) ................................ 2007-004205
Apr. 16, 2007 (JP) ................................ 2007-106741
Nov. 21, 2007 (JP) ................................ 2007-302009

(51) Int. Cl.
*G02B 5/20* (2006.01)
(52) U.S. Cl. ........................................................ 430/7
(58) Field of Classification Search ........................ None
See application file for complete search history.

(56) References Cited

U.S. PATENT DOCUMENTS

| 6,455,207 | B1 | 9/2002 | Katoh et al. |
| 2005/0119432 | A1 | 6/2005 | Sakayori |
| 2006/0036023 | A1 | 2/2006 | Kamata et al. |

FOREIGN PATENT DOCUMENTS

| JP | 9-269410 | 10/1997 |
| JP | 10-253815 | 9/1998 |
| JP | 10-253816 | 9/1998 |
| JP | 10-253817 | 9/1998 |
| JP | 2000-249822 | 9/2000 |
| JP | 2003-156842 | 5/2003 |
| JP | 2004-198542 | 7/2004 |
| JP | 2005-314633 | 11/2005 |
| JP | 2006-039140 A * | 2/2006 |
| JP | 2006-133378 | 5/2006 |

OTHER PUBLICATIONS

Computer-generated translation of JP 2006-039140 (Feb. 2006).*
English Translation of the International Preliminary Report on Patentability mailed Jul. 23, 2009 in corresponding International Patent Application PCT/JP2008/050276.
International Search Report for PCT/JP2008/050276, mailed Apr. 15, 2008.

* cited by examiner

*Primary Examiner* — John A. McPherson

(57) ABSTRACT

A method of manufacturing a color filter, includes forming a colored coated film on a substrate using a colored composition containing a pigment, a monomer having an ethylenic unsaturated double bond and photo-polymerization initiator, irradiating a filter segment-forming region or a black matrix-forming region of the colored coated film with an excimer laser beam having a wavelength of 308 nm (XeCL) at a dosage sufficient to achieve a cumulative light exposure of 1-150 mJ/cm², thereby curing the irradiated region, removing uncured portions of the colored coated film to form the filter segment or the black matrix, and repeating the above-described steps plural times, thereby forming filter segments of at least two colors and/or a black matrix.

12 Claims, No Drawings

COLORED COMPOSITION, COLOR FILTER AND MANUFACTURING METHOD THEREOF

CROSS-REFERENCE TO RELATED APPLICATIONS

This is a Continuation Application of PCT Application No. PCT/JP2008/050276, filed Jan. 11, 2008, which was published under PCT Article 21(2) in Japanese.

This application is based upon and claims the benefit of priority from prior Japanese Patent Applications No. 2007-004205, filed Jan. 12, 2007; No. 2007-106741, filed Apr. 16, 2007; and No. 2007-302009, filed Nov. 21, 2007, the entire contents of all of which are incorporated herein by reference.

BACKGROUND OF THE INVENTION

1. Field of the Invention

The present invention relates to a colored composition to be used for the manufacture of a color filter to be used in a color liquid crystal display device, a color image pickup device, etc., to a color filter and to the manufacturing method thereof.

2. Description of the Related Art

A filter segment or a black matrix, which constitutes a color filter for use in a color liquid crystal display device, a color image pickup device, etc., can be manufactured by a process including coating a substrate such as a glass substrate with a photosensitive material to form a photosensitive layer, drying the layer to remove any excess solvent therefrom, and irradiating the layer with an active energy beam by the application of proximity exposure (ultraviolet source exposure) through a photomask designed for forming pixels, thereby curing the layer (negative type) or increasing the alkali-solubility of the layer (positive type) to create easily dissoluble portions, which are subsequently selectively dissolved by making use of an alkaline solution, etc. This process is repeated for each color, thereby manufacturing a color filter.

In recent years, a color liquid crystal display device is widely employed in liquid crystal color televisions, in car navigation, and in liquid crystal display device-integrated notebook-sized personal computers, thus representing a large market. Further, by taking advantage of the characteristics of color liquid crystal display devices, such as energy-saving and space-saving, liquid crystal display devices are now propagated as a monitoring device for desktop personal computers and televisions. Additionally, as liquid crystal display devices have gained much market penetration, there is an increasing demand for improvements in the color reproduction characteristics.

Further, it has been generally practiced to interpose a black matrix between the filter segments constituting each pixel of the color filter in order to improve the color contrast. However, from the viewpoints of overcoming environmental problems, lowering the reflection of the black matrix and reducing the manufacturing cost, the employment of a resinous black matrix containing a light-shielding pigment dispersed in a resin has now attracted attention as a possible candidate to replace the conventional metallic chrome black matrix. This resinous black matrix, however, is accompanied with a problem that the light-shielding property (optical concentration) thereof is lower than that of the metallic chrome black matrix.

In order to improve the color reproduction characteristics of the color filter and also to improve the light-shielding property of the resinous black matrix, it is necessary to increase the content of the pigment in a photosensitive colored composition constituting the black matrix or to increase the thickness of the black matrix. However, according to the conventional technique wherein proximity exposure (ultraviolet source exposure) is employed as an active energy source, when the content of the pigment is increased, various problems are caused to arise, such as a lowering of the sensitivity, a deterioration in the developing property, a deterioration in the resolving property, etc. On the other hand, when the film thickness of the resinous black matrix is increased, it may become difficult for the exposure light to reach the bottom portion of the film, raising various problems such as a deterioration in not only the linearity but also the sectional configuration in the filter segment and the black matrix, etc.

In order to overcome these problems, it is required to enhance the sensitivity of the photosensitive colored composition, as is suggested in JP-A 2003-156842, wherein (1) the addition of a reactive double bond to a resin; (2) the selection or content increase of a photo-polymerization initiator or of a photosensitizer; and (3) the selection or content increase of a monomer are disclosed.

On the other hand, due to a trend in recent years to further increase the size of display devices equipped with a color filter, the size of the photomask for forming the filter segment and the black matrix is also inevitably required to be made larger, thereby leading to an increase in manufacturing cost.

Meanwhile, JP-A 9-269410 describes, as means for exposure processing, the employment of an active energy beam such as ultraviolet ray, excimer laser beam, X-ray, gamma ray, electron beam, etc. which is designed to be irradiated at a dosage of 30-2000 $mJ/cm^2$. Although concept of curing a colored composition through the irradiation of excimer laser beam as an active energy beam source is known, as described in the aforementioned Publication, there is no publication disclosing a method for creating a color filter by making use of an excimer laser. Likewise, no one has succeeded as yet in developing a colored composition which is compatible with an excimer laser and can be put into practical use.

In the case of the proximity exposure method (ultraviolet source exposure method) which has been generally employed, in order to enable a large substrate to be treated, a photomask which is expensive and large in size so as to match the size of the substrate is required to be employed. Therefore, there is a problem of how to reduce the manufacturing cost of the photomask.

Further, when the content of a coloring matter such as pigment is increased so as to improve the color reproduction characteristics and light-shielding properties of a color filter, the curing of the photosensitive colored composition may be obstructed. In order to overcome this problem, it is necessary to increase the content of a photo-polymerization initiator or to additionally incorporate a photosensitizer. However, since the photo-polymerization initiator is very expensive, the problem is how to reduce the quantity of the photo-polymerization initiator to lower the manufacturing cost of the color filter.

Additionally, the employment of a different kind of photo-polymerization initiator for each color of the photosensitive colored composition is disadvantageous in terms of delivery as well as in the embodiment of manufacturing cost.

BRIEF SUMMARY OF THE INVENTION

It is an object of the present invention to provide a colored composition which is suited for a method of manufacturing a color filter by means of laser exposure, to provide a color filter to be manufactured by making use of this colored composition, and to provide a method of manufacturing a color filter by means of laser exposure, which makes it possible to miniaturize a photomask or to dispense with the employment of a photomask.

According to a first aspect of the present invention, there is provided a colored composition comprising a pigment, a monomer having an ethylenic unsaturated double bond, and a photo-polymerization initiator, the colored composition being adapted to be employed in a manufacturing method of a color filter, which comprises: coating a substrate with a colored composition to form a colored coated film; irradiating a filter segment-forming region or a black matrix-forming region of the colored coated film with an excimer laser beam having a wavelength of 308 nm (XeCL) at a dosage sufficient to achieve a cumulative light exposure of 1-150 mJ/cm$^2$, to cure the irradiated region; removing uncured portions of the colored coated film to form the filter segment or the black matrix; and repeating the above-described steps plural times while changing the kind of the colored composition to form filter segments of at least two colors and/or a black matrix.

According to a second aspect of the present invention, there is provided a colored composition comprising a pigment, a transparent resin, a polyfunctional monomer having at least four ethylenic unsaturated double bonds, a photo-polymerization initiator, and polyfunctional thiol, the colored composition being adapted to be cured by the irradiation of an excimer laser beam having a wavelength of 308 nm (XeCL).

According to a third aspect of the present invention, there is provided a color filter which is provided with a filter segment and/or a black matrix which is formed through the steps of exposing a colored coated film obtained by the coating of the aforementioned colored composition to a predetermined patterning irradiation to cure the irradiated portions; and removing the un-cured portions.

According to a fourth aspect of the present invention, there is provided a method of manufacturing a color filter, which comprises: coating a substrate with the colored composition claimed in claim 1 to form a colored coated film; irradiating a filter segment-forming region or a black matrix-forming region of the colored coated film with an excimer laser beam having a wavelength of 308 nm (XeCL) at a dosage sufficient to achieve a cumulative light exposure of 1-150 mJ/cm$^2$ to cure the irradiated region; removing uncured portions of the colored coated film to form the filter segment or the black matrix; and repeating the above-described steps plural times while changing the kind of the colored composition to form filter segments of at least two colors and/or a black matrix.

DETAILED DESCRIPTION OF THE INVENTION

Following is an explanation of the various embodiments of the present invention.

First of all, the colored composition according to various embodiments of the present invention will be explained.

The colored composition according to a first embodiment of the present invention is featured in that it comprises a pigment, a monomer having an ethylenic unsaturated double bond, and a photo-polymerization initiator, and that this colored composition is adapted to be employed in a manufacturing method of a color filter, which comprises: coating a colored composition to form a colored coated film on a substrate; irradiating an excimer laser beam having a wavelength of 308 nm (XeCL) to a filter segment-forming region or a black matrix-forming region of the colored coated film at a dosage sufficient to achieve a cumulative light exposure of 1-150 mJ/cm$^2$ to cure the irradiated region; removing uncured portions of the colored coated film to form the filter segment or the black matrix; and repeating the above-described steps plural times while changing the kind of the colored composition to form filter segments of at least two colors and/or a black matrix.

Further, a colored composition according to a second embodiment of the present invention is featured in that it comprises a pigment, a polyfunctional monomer having at least four ethylenic unsaturated double bonds, a photo-polymerization initiator, and polyfunctional thiol, the colored composition being adapted to be cured by the irradiation of an excimer laser beam.

By making use of the aforementioned colored composition, it is now possible to create a color filter which is provided with filter segments and/or a black matrix which are excellent in configuration and can be manufactured at a low cost.

According to the aforementioned colored composition, since this composition can be cured within a very short period of time through the irradiation of an excimer laser beam having a specific wavelength and a low output for a short period of time, it is possible to form a filter segment and a black matrix each excellent in configuration at a low cost using a photomask of small size or without using a photomask. Additionally, since the quantity of the photo-polymerization initiator in the colored composition can be reduced, it is possible to reduce the cost for the colored composition, thereby making it possible to form a filter segment and a black matrix at a low cost.

Next, each of the components constituting the colored compositions according to the first and the second embodiments of the present invention will be explained.

The components to be contained in the colored composition according to the first embodiment of the present invention are a pigment, a monomer having an ethylenic unsaturated double bond, and a photo-polymerization initiator.

(Pigments)

With respect to the pigment to be contained in the colored composition according to this first embodiment, it is possible to employ organic pigments which are generally available in the market. Depending on the hue of the filter segment desired to be formed, it is possible to use in combination with dyes, natural pigments or inorganic pigments.

As for the organic pigment, it is preferable to employ those which are high in color-developing property and also excellent in heat resistance and thermal decomposition resistance. The organic pigment can be employed singly or in combination of two or more kinds thereof.

Further, the organic pigment may be one which is finely-ground by means of salt milling, acid pasting, etc.

Following are specific examples of the organic pigment that can be used in the colored composition according to this first embodiment, these organic pigments being respectively represented by a color index (C.I.) number.

For the formation of the red filter segment by making use of the colored composition according to this first embodiment, it is possible to employ red pigments such as C.I. Pigment Red 7, 9, 14, 41, 48:1, 48:2, 48:3, 48:4, 81:1, 81:2, 81:3, 122, 123, 146, 168, 177, 178, 179, 184, 185, 187, 192, 200, 202, 208, 210, 216, 220, 223, 224, 226, 240, 254, 255, 264, 272, etc. This red colored composition may be employed together with a yellow pigment or an orange pigment.

For the formation of the green filter segment by making use of the colored composition according to this first embodiment, it is possible to employ green pigments such as C.I. Pigment Green 7, 10, 36, 37, 58, etc. This green colored composition may be employed together with a yellow pigment.

For the formation of the blue filter segment by making use of the colored composition according to this first embodiment, it is possible to employ blue pigments such as C.I. Pigment Blue 15, 15:1, 15:2, 15:3, 15:4, 15:6, 16, 64, 80, etc. Further, this blue colored composition may be used together with a violet pigment.

For the formation of the yellow filter segment by making use of the colored composition according to this first embodiment, it is possible to employ C.I. Pigment Yellow 1, 2, 3, 4, 5, 6, 10, 12, 13, 14, 15, 16, 17, 18, 24, 31, 32, 34, 35, 35:1, 36, 36:1, 37, 37:1, 40, 42, 43, 53, 55, 60, 61, 62, 63, 65, 73, 74, 77, 81, 83, 93, 94, 95, 97, 98, 100, 101, 104, 106, 108, 109, 110, 113, 114, 115, 116, 117, 118, 119, 120, 123, 126, 127, 128, 129, 138, 139, 147, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 198, 199, 213, 214, etc.

For the formation of the violet filter segment by making use of the colored composition according to this first embodiment, it is possible to employ C.I. Pigment Violet 1, 19, 23, 27, 29, 30, 32, 37, 40, 42, 50, etc.

For the formation of the magenta filter segment by making use of the colored composition according to this first embodiment, it is possible to employ pigments such as C.I. Pigment Red 7, 14, 41, 48:1, 48:2, 48:3, 48:4, 81:1, 81:2, 81:3, 146, 177, 178, 184, 185, 187, 200, 202, 208, 210, 246, 254, 255, 264, 270, 272, etc. Incidentally, this magenta colored composition may be employed together with a yellow pigment.

For the formation of the cyan color filter segment by making use of the colored composition according to this first embodiment, it is possible to employ pigments such as C.I. Pigment Blue 15:1, 15:2, 15:3, 15:4, 15:6, 16, 80, etc.

For the formation of the orange color filter segment by making use of the colored composition according to this first embodiment, it is possible to employ C.I. Pigment Orange 36, 43, 51, 55, 59, 61, 71, 73, etc.

For the formation of the black matrix by making use of the colored composition according to this first embodiment, it is possible to employ carbon black, aniline black, anthraquinone-based black pigment, perylene-based black pigment, specific examples of these pigments including C.I. Pigment Black 1, 6, 7, 12, 20, 31, etc. A mixture of a red pigment, blue pigment and green pigment can be used as the black colored composition. As for specific examples of the black pigment, it is preferable to employ carbon black in terms of price and magnitude of light-shielding property. This carbon black particles may be surface-treated with a resin. Further, in order to regulate the color tone, the black colored composition may be used together with a blue pigment or a violet pigment.

In order to secure excellent coating properties, sensitivity and developing properties of a colored composition while making it possible to retain a balance between the chroma and brightness, the colored composition may contain an inorganic pigment. As for specific examples of the inorganic pigment, they include titanium oxide, barium sulfate, zinc white, lead sulfate, yellow lead, zinc yellow, red iron oxide (red iron oxide (III)), cadmium red, ultramarine blue, Prussian blue, chromium oxide green, cobalt green, amber, titanium black, synthesized iron black, carbon black, etc. These inorganic pigments may be used singly or in combination of two or more kinds thereof. These inorganic pigments may be used at a ratio of 0.1-10% by weight based on a total weight (100% by weight) of pigments.

Further, for the purpose of toning, a colored composition according to this embodiment of the present invention may further contain dyes within the limits which do not deteriorate the heat resistance of the color filter. Dyes may be used at a ratio of 0.1-10% by weight based on a total weight (100% by weight) of pigments.

(Monomers having an Ethylenic Unsaturated Double Bond)

The monomers having an ethylenic unsaturated double bond and to be used in the colored composition according to this first embodiment of the present invention are components that can be cured through the irradiation of an excimer laser beam.

As for specific examples of the monomers having an ethylenic unsaturated double bond, they include various kinds of acrylic esters and methacrylic esters such as 2-hydroxyethyl (metha)acrylate, 2-hydroxypropyl(metha)acrylate, cyclohexyl(metha)acrylate, polyethyleneglycol di(metha)acrylate, pentaerythritol tri(metha)acrylate, trimethylolpropane (metha)acrylate, dipentaerythritol hexa(metha)acrylate, tricyclodecanyl(metha)acrylate, melamine(metha)acrylate, epoxy(metha)acrylate, etc.; (metha)acrylic acid; styrene; vinyl acetate; (metha)acryl amide; N-hydroxymethyl(metha) acryl amide; acrylonitrile; etc.

A polyfunctional (metha)acrylate having a carboxylic group may be employed as a monomer having an ethylenic unsaturated double bond. The employment of this polyfunctional (metha)acrylate having a carboxylic group is more preferable as compared with a polyfunctional (metha)acrylate having no carboxylic group in view of improving not only the linearity but also the sectional configuration of the filter segment. Specific examples of this polyfunctional (metha) acrylate having a carboxylic group include compounds to be obtained from the esterification of polyhydroxy (not less than tri-hydroxy) alcohol, (metha)acrylic acid and polyvalent carboxylic acid. This polyfunctional (metha)acrylate having a carboxylic group may contain an urethane bond in its molecular structure. As for specific examples of actual carboxylic group-containing polyfunctional (metha)acrylate products on the market, they include, for example, TO-1382 (trade name; dibasic acid anhydride adduct of dipentaerythritol penta(metha)acrylate; Toua Gosei Co., Ltd.).

(Photo-Polymerization Initiator)

The photo-polymerization initiator to be used may preferably be selected from those which are capable of exhibiting a larger molar absorption coefficient at a wavelength of 308 nm ($\epsilon_{308}$) as compared with a molar absorption coefficient at a wavelength of 365 nm ($\epsilon_{365}$). The term "molar absorption coefficient" represents a value obtained through the conversion of the absorption spectrum at any of these wavelengths, which is obtained by subjecting the sample prepared by diluting a photo-polymerization initiator with acetonitrile to a concentration of about $1.0\times10^{-5}$ mole/mL to measurement.

Preferable examples of the photo-polymerization initiator are an oxime ester-based photo-polymerization initiator, an acylphosphine oxide-based photo-polymerization initiator, an α-aminoalkyl phenone-based photo-polymerization initiator and a carbazole-based photo-polymerization initiator represented by the following general formula (1).

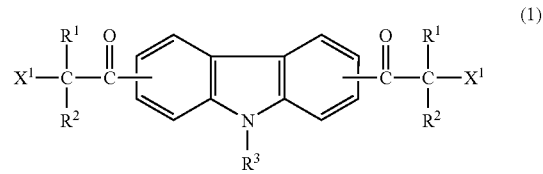

wherein, $R^3$ is a hydrogen atom or an alkyl group having 1-20 carbon atoms; $R^1$ and $R^2$ are individually a hydrogen atom, an alkyl group having 1-5 carbon atoms or aryl group having 6-14 carbon atoms; and $X^1$ is a morpholino group.

Especially preferable examples of the oxime ester-based photo-polymerization initiator are ethanone, 1-[9-ethyl-6-(2-methylbenzoyl)-9H-carbazol-3-yl]-, 1-(O-acetyloxime) and 1,2-octadione-1-[4-(phenylthio)-, 2-(O-benzoyloxime)].

Especially preferable examples of the acylphosphine oxide-based photo-polymerization initiator include 2,4,6-trimethylbenzoyl-diphenylphosphine oxide.

Especially preferable examples of the α-aminoalkyl phenone-based photo-polymerization initiator are 2-methyl-1-(4-methylthiophenyl)-2-morpholinopropan-1-one and 2-benzyl-2-dimethylamino-1-(4-morpholinophenyl)-butane-1,2-(dimethylamino)-2-[(4-methylthiophenyl)methyl]-1-[4-(4-morpholynyl)phenyl]-1-butanone.

Especially preferable examples of the carbazole-based photo-polymerization initiator represented by the above-described general formula (1) are 3,6-bis(2-methyl-2-morpholinopropionyl)-9-methylcarbazole, 3,6-bis(2-methyl-2-morpholinopropionyl)-9-benzoylcarbazole, 3,6-bis(2-methyl-2-morpholinopropionyl)-9-n-butylcarbazole, 3,6-bis(2-methyl-2-morpholinopropionyl)-9-n-octylcarbazole and 3,6-bis(2-methyl-2-morpholinopropionyl)-9-n-dodecylcarbazole.

A photo-polymerization initiator to be contained in each of the various colored compositions for forming at least two different color filter segments and/or a black matrix may preferably be the same in at least two different colored compositions for the convenience of the delivery thereof and in view of reducing the manufacturing cost. It is more preferable to create all of the colored compositions by making use of the same photo-polymerization initiator.

The above-described preferable photo-polymerization initiators may be used together with those other than the aforementioned oxime ester-based photo-polymerization initiator, acylphosphine oxide-based photo-polymerization initiator, α-aminoalkyl phenone-based photo-polymerization initiator and carbazole-based photo-polymerization initiator. It is also possible to employ other kinds of photo-polymerization initiators including an acetophenone-based photo-polymerization initiator such as 4-phenoxy dichloroacetophenone, 4-t-butyl-dichloroacetophenone, diethoxyacetophenone, 1-(4-isopropylphenyl)-2-hydroxy-2-methylpropan-1-one, 1-hydroxycyclohexylphenyl ketone; a benzoin-based photo-polymerization initiator such as benzoin, benzoin methyl ether, benzoin ethyl ether, benzoin isopropyl ether, benzyldimethyl ketal, etc.; a benzophenone-based photo-polymerization initiator such as benzophenone, benzoylbenzoic acid, benzoylmethyl benzoate, 4-phenyl benzophenone, hydroxybenzophenone, acrylated benzophenone, 4-benzoyl-4'-methyldiphenyl sulfide, 3,3',4,4'-tetra(t-butylperoxycarbonyl)benzophenone, etc.; a thioxanthone-based photo-polymerization initiator such as thioxanthone, 2-chlorothioxanthone, 2-methylthioxanthone, isopropylthioxanthone, 2,4-diisopropylthioxanthone, 2,4-diethylthioxanthone, etc.; a triazine-based photo-polymerization initiator such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s-triazine, 2,4-bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl-(piperonyl)-6-triazine, 2,4-trichloromethyl(4'-methoxystyryl)-6-triazine, etc.; quinone-based photo-polymerization initiator such as 9,10-phenanthrene quinine, camphorquinine, ethylanthraquinone, etc.; a borate-based photo-polymerization initiator; an imidazole-based photo-polymerization initiator; a tinanocene-based photo-polymerization initiator etc.

More preferably, at least one kind of a first photo-polymerization initiator selected from the group consisting of the aforementioned oxime ester-based photo-polymerization initiator, acylphosphine oxide-based photo-polymerization initiator, α-aminoalkyl phenone-based photo-polymerization initiator and carbazole-based photo-polymerization initiator may be used together with a second photo-polymerization initiator selected from α-hydroxyketone-based photo-polymerization initiators having 2-4 hydroxyl groups.

A photo-polymerization initiator which has only one hydroxyl group such as 1-hydroxy-cyclohexyl-phenyl-ketone and 2-hydroxy-2-methyl-1-phenyl-propan-1-one may not be preferable for use because of poor adhesion between a cured film to be obtained and a substrate.

In the case of a photo-polymerization initiator having more than four hydroxyl groups, the molecular weight thereof may become too large, thereby deteriorating the capability thereof to cure a coated film, resulting in partial peel-off of the coated film and hence the employment of such a photo-polymerization initiator may be undesirable.

Specific examples of the α-hydroxyketone-based photo-polymerization initiators having 2-4 hydroxyl groups include 1-[4-(2-hydroxyethoxy)phenyl]-2-hydroxy-2-methyl-1-propan-1-one, 2-hydroxy-1-[4-[4-(2-hydroxy-2-methyl-1-propionyl)-benzyl]-phenyl]-2-methyl-propan-1-one, 2-hydroxy-1-{4-[4-(2-hydroxy-2-methyl-1-propionyl)-phenoxy]-phenyl}-2-methyl-propan-1-one, 2-hydroxy-1-(4-{2-[4-(2-hydroxy-2-methyl-propionyl)-phenyl]-ethyl}-phenyl)-2-methyl-propan-1-one, 2-hydroxy-1-(4-{1-[4-(2-hydroxy-2-methyl-propionyl)-phenyl]-1,1-dimethyl}-phenyl)-2-methyl-propan-1-one, etc.

The weight ratio between the weight (a) of the aforementioned at least one kind of a first photo-polymerization initiator selected from the group consisting of the aforementioned oxime ester-based photo-polymerization initiator, acylphosphine oxide-based photo-polymerization initiator, α-aminoalkyl phenone-based photo-polymerization initiator and carbazole-based photo-polymerization initiator and the weight (b) of the aforementioned second photo-polymerization initiator selected from α-hydroxyketone-based photo-polymerization initiators having 2-4 hydroxyl groups may preferably be confined to the range of: (a):(b)=99:1-40:60. When the ratio of (b) is less than 1, it may become difficult to sufficiently secure the effects of the α-hydroxyketone-based photo-polymerization initiators to mildly cure a coated layer of the colored composition. On the other hand, when the ratio of (b) is larger than 60, it may become impossible to cure the coated film, resulting in the removal of the coated film by an alkaline developing solution, and deterioration of the film-reducing ratio. More preferably, the weight ratio (a):(b) may be confined to 95:5-50:50.

These photo-polymerization initiators can be employed singly or in combination of two or more kinds thereof.

The content of the photo-polymerization initiator may preferably be confined to 0.1-200 parts by weight, more preferably 0.1-150 parts by weight based on 100 parts by weight of the pigment.

Further, the ratio (I/M) of the weight (I) of photo-polymerization initiator to the weight (M) of the monomer having an ethylenic unsaturated double bond may preferably be confined to the range of 0.01-0.45.

In viewpoint of reducing the manufacturing cost through the reduction in quantity of the photo-polymerization initiator, the aforementioned ratio (I/M) may be as small as possible or not more than 0.30. However, in viewpoint of enabling the photo-polymerization initiator to exhibit its fundamental effects, the ratio (I/M) may be not less than 0.01.

The components to be contained in the colored composition according to the second embodiment of the present invention are a pigment, a transparent resin, a polyfunctional monomer having at least four ethylenic unsaturated double bonds, a photo-polymerization initiator, and polyfunctional thiol. Among these components, the pigment and the photo-polymerization initiator may be the same as those employed in the colored composition according to the first embodiment of the present invention. Therefore, in the following description, the features of the transparent resin, which is a polyfunctional monomer having at least four ethylenic unsaturated double bonds and polyfunctional thiol, will be explained.

In this second embodiment of the present invention, the content of the photo-polymerization initiator is confined to 5-200 parts by weight, more preferably 10-150 parts by weight based on 100 parts by weight of the pigment.

(Transparent Resins)

The transparent resin to be employed herein may preferably have a permeability of not less than 80%, more preferably not less than 95% in a total wavelength range of 400-700 nm of the visible light zone. As for specific examples of the transparent resin, it is possible to employ a thermoplastic resin, thermosetting resin and photosensitive resin. These resins can be employed singly or in combination of two or more kinds thereof.

As for the thermoplastic resin, it is possible to employ, for example, butyral resin, styrene-maleic acid copolymer, chlorinated polyethylene, chlorinated polypropylene, polyvinyl chloride, vinyl chloride-vinyl acetate copolymer, polyvinyl acetate, polyurethane resin, polyester resin, acrylic resin, alkyd resin, polystyrene, polyamide resin, rubber type resin, cyclized rubber-based resin, celluloses, polybutadien, polyethylene, polypropylene, polyimide, etc.

As for the thermosetting resin, it is possible to employ, for example, epoxy resin, benzoguanamine resin, rosin-modified maleic resin, rosin-modified fumaric acid resin, melamine resin, urea resin, phenol resin, etc.

As for the photosensitive resin, it is possible to employ resins constituted by a linear polymer into which a photo-curable group such as a (metha)acryloyl group, styryl group, etc. has been introduced through a reaction between a linear polymer having a reactive substituent group such as a hydroxyl group, carboxyl group, amino group, etc. and a (metha)acrylic compound having a reactive substituent group such as an isocyanate group, aldehyde group, epoxy group, etc. or cinnamic acid. It is also possible to employ a linear polymer containing an acid anhydride such as a styrene-maleic anhydride copolymer or α-olefin-maleic anhydride copolymer, which is half-esterified with a (metha)acrylic compound having a hydroxyl group such as hydroxyalkyl (metha)acrylate.

In order to improve the dispersion of pigment or to enhance the adhesion between the colored composition and a coating substrate, any of the aforementioned transparent resins may be contained in the colored composition according to the first embodiment of the present invention.

(Polyfunctional Monomer having at least Four Ethylenic Unsaturated Double Bonds)

As for representative examples of the polyfunctional monomer having at least four ethylenic unsaturated double bonds, they include various kinds of acrylic ester and methacrylic ester such as pentaerythritol tetra(metha)acrylate, dipentaerythritol penta(metha)acrylate, dipentaerythritol hexa(metha)acrylate, caprolactone-modified dipentaerythritol hexa(metha)acrylate, etc.

In viewpoint of increasing the sensitivity of the colored composition, the polyfunctional monomer may preferably have 4-12 ethylenic unsaturated double bonds. In the case of the colored composition containing a polyfunctional monomer having not more than three ethylenic unsaturated double bonds, it may be impossible to secure a desired sensitivity.

The polyfunctional monomer having at least four ethylenic unsaturated double bonds may be employed singly or in combination of two or more kinds thereof.

The mixing ratio of the polyfunctional monomer having at least four ethylenic unsaturated double bonds may preferably be confined to 10-300 parts by weight, more preferably 10-200 parts by weight based on 100 parts by weight of the pigment.

Further, the ratio (M/P) of the weight (M) of the polyfunctional monomer having at least four ethylenic unsaturated double bonds to the weight (P) of the transparent resin may preferably be confined to the range of 0.60-2.00. If it is desired to enhance the sensitivity of the colored composition, this ratio (M/P) may preferably be not lower than 0.65, most preferably not lower than 0.70. If it is desired to improve the sectional configuration of the pattern, this ratio (M/P) may preferably be not higher than 1.80, most preferably not higher than 1.60.

Furthermore, the ratio (I/M) of the weight (I) of the photo-polymerization initiator to the weight (M) of the polyfunctional monomer having at least four ethylenic unsaturated double bonds may preferably be confined to 0.05-0.50. If it is desired to enhance the sensitivity of the colored composition, this ratio (I/M) may preferably be not lower than 0.08, most preferably not lower than 0.10. If it is desired to improve the sectional configuration of the pattern, this ratio (I/M) may preferably be not higher than 0.45, most preferably not higher than 0.40.

(Polyfunctional Thiol)

As for this polyfunctional thiol, it is possible to employ a compound having two or more thiol groups. Specific examples of such a compound include hexane dithiol, decane dithiol, 1,4-butanediol bisthiopropionate, 1,4-butanediol bisthioglycolate, ethyleneglycol bisthioglycolate, ethyleneglycol bisthiopropionate, trimethylolpropane tristhioglycolate, trimethylolpropane tristhiopropionate, trimethylolpropane tris(3-mercaptobutylate), pentaerythritol tetrakisthioglycolate, pentaerythritol tetrakisthiopropionate, trimercaptopropionate tris(2-hydroxyethyl)isocyanulate, 1,4-dimethylmercaptobenzene, 2,4,6-trimercapto-s-triazine, 2-(N,N-dibutylamino)-4,6-dimercapto-s-triazine, etc. These polyfunctional thiols can be employed singly or in combination of two or more kinds. The mixing ratio of these polyfunctional thiols may preferably be confined within the range of 0.05 to 100 parts by weight, more preferably 0.1 to 60 parts by weight based on 100 parts by weight of the pigment.

Incidentally, these polyfunctional thiols can be also contained as a chain-transfer agent in the colored composition of the first embodiment of the present invention.

The colored composition of the first and the second embodiments of the present invention may also contain the following optional components.

(Optional Components)

The colored composition of the present invention does not fundamentally necessitate the employment of a photosensitizer. However, a photosensitizer may be co-used with a photo-polymerization initiator. Specific examples of the photosensitizer include amine-based compounds such as triethanol amine, methyldiethanol amine, triisopropanol amine, 4-dimethylaminomethyl benzoate, 4-dimethylaminoethyl benzoate, 4-dimethylaminoisoamyl benzoate, 2-dimethylaminoethyl benzoate, 4-dimethylamino-2-ethylhexyl benzoate, N,N-dimethylparatoluidine, 4,4'-bis(dimethylamino) benzophenone, 4,4'-bis(diethylamino)benzophenone, 4,4'-bis(ethylmethylamino)benzophenone, etc. These photosensitizers can be employed singly or in combination of two or more kinds thereof. With respect to the mixing ratio of these photosensitizers, it may preferably be confined to the range of 0.1-60 parts by weight based on 100 parts by weight of the pigment. With respect to the mixing ratio of these photosensitizers on the basis of the weight of the total solids of the colored composition, it may preferably be confined to the range of 0.7-10.0 parts by weight. In this case, if it is desired to increase the sensitivity of the colored composition, the mixing ratio of these photosensitizers may preferably be not less than 0.8 parts by weight, most preferably not less than 1.0 part by weight. Further, if it is desired to obtain an excellent configuration of pattern, the mixing ratio of these photosensitizers may preferably be not more than 8.0 parts by weight, most preferably not more than 7.0 parts by weight.

The colored composition of the present invention may further contain a storage stabilizing agent for stabilizing the time viscosity of the composition. Further, the colored composition of the present invention may contain an adherence improver such as a silane coupling agent for the purpose of enhancing the adhesion to the transparent substrate.

As for specific examples of the storage stabilizing agent, they include, for example, quaternary ammonium chlorides such as benzyltrimethyl chloride, diethylhydroxy amine, etc.; organic acids such as lactic acid, oxalic acid, etc. and methyl ethers thereof; t-butyl pyrocatechol; organic phosphine such as tetraethyl phosphine, tetraphenyl phosphine, etc.; phosphite; etc. The storage stabilizing agent can be employed at a ratio of 0.1-10 parts by weight based on 100 parts by weight of the pigment in a colored composition.

As for specific examples of the silane coupling agent, they include vinyl silanes such as vinyl tris(β-methoxyethoxy) silane, vinylethoxy silane, vinyltrimethoxy silane, etc.; (metha)acrylsilanes such as γ-methacryloxypropyl silane, etc.; epoxy silanes such as β-(3,4-epoxycyclohexyl)ethyltrimethoxy silane, β-(3,4-epoxycyclohexyl)methyltrimethoxy silane, β-(3,4-epoxycyclohexyl)ethyltriethoxy silane, β-(3,4-epoxycyclohexyl)methyltriethoxy silane, γ-glycidoxypropyl trimethoxy silane, γ-glycidoxypropyl triethoxy silane, etc.; amino silanes such as N-β(aminoethyl)γ-aminopropyl trimethoxy silane, N-β(aminoethyl)γ-aminopropyl triethoxy silane, N-β(aminoethyl)γ-aminopropyl methyldiethoxy silane, γ-aminopropyl triethoxy silane, γ-aminopropyl trimethoxy silane, N-phenyl-γ-aminopropyl trimethoxy silane, N-phenyl-γ-aminopropyl triethoxy silane, etc.; and thiosilanes such as γ-mercaptopropyl trimethoxy silane, γ-mercaptopropyl triethoxy silane, etc. These silane coupling agents can be employed at a ratio of 0.01-10 parts by weight, preferably 0.05-5 parts by weight based on 100 parts by weight of the pigment in a colored composition.

The colored composition of the present invention may further contain a solvent for enabling pigments to be sufficiently dispersed in the colored composition and for coating the colored composition at a dry thickness of 0.2 μm-5 μm on a substrate such as a glass substrate, thus facilitating the formation of the filter segments or the black matrix.

Specific examples of the solvent include 1,2,3-trichloropropane, 1,3-butanediol, 1,3-butylene glycol, 1,3-butylene glycol diacetate, 1,4-dioxane, 2-heptanone, 2-methyl-1,3-propanediol, 3,5,5-trimethyl-2-cyclohexen-1-one, 3,5,5-trimethyl cyclohexanone, 3-ethoxyethylpropionate, 3-methyl-1,3-butanediol, 3-methoxy-3-methyl-1-butanol, 3-methoxy-3-methylbutyl acetate, 3-methoxybutanol, 3-methoxybutyl acetate, 4-heptanone, m-xylene, m-diethylbenzene, m-dichlorobenzene, N,N-dimethyl acetoamide, N,N-dimethyl formamide, n-butyl alcohol, n-butyl benzene, n-propyl acetate, N-methylpyrrolidone, o-xylene, o-chlorotoluene, o-diethyl benzene, o-dichlorobenzene, p-chlorotoluene, p-diethyl benzene, sec-butyl benzene, tert-butyl benzene, γ-butyrolactone, isobutyl alcohol, isophorone, ethyleneglycol diethyl ether, ethyleneglycol dibutyl ether, ethyleneglycol monoisopropyl ether, ethyleneglycol monoethyl ether, ethyleneglycol monoethyl ether acetate, ethyleneglycol monotertiary butylether acetate, ethyleneglycol monobutyl ether, ethyleneglycol monobutylether acetate, ethyleneglycol monopropyl ether, ethyleneglycol monohexyl ether, ethyleneglycol monomethyl ether, ethyleneglycol monomethylether acetate, diisobutyl ketone, diethylglycol diethyl ether, diethylglycol dimethyl ether, diethylglycol monoisopropyl ether, ethyleneglycol monoethylether acetate, ethyleneglycol monobutyl ether, ethyleneglycol monobutylether acetate, ethyleneglycol monomethyl ether, cyclohexanol, cyclohexanol acetate, cyclohexanone, dipropyleneglycol dimethyl ether, dipropyleneglycol methylether acetate, dipropyleneglycol monoethyl ether, dipropyleneglycol monobutyl ether, dipropyleneglycol monopropyl ether, dipropyleneglycol monomethyl ether, diacetone alcohol, treacetine, tripropyleneglycol monobutyl ether, tripropyleneglycol monomethyl ether, propyleneglycol diacetate, propyleneglycol phenylether, propyleneglycol monoethyl ether, propyleneglycol monoethylether acetate, propyleneglycol monobutyl ether, propyleneglycol monopropyl ether, propyleneglycol monomethyl ether, propyleneglycol monomethylether acetate, propyleneglycol monomethylether propionate, benzyl alcohol, methylisobutyl ketone, methylcyclohexanol, n-amyl acetate, n-butyl acetate, isoamyl acetate, isobutyl acetate, propyl acetate, dibasic acid ester, etc. These compounds can be used singly or in combination of two or more kinds thereof.

On the occasion of dispersing pigments in a monomer having an ethylenic unsaturated double bond or in a transparent resin, a dispersing agent such as a surfactant, a resin type pigment dispersing agent, a pigment derivative, etc. can be optionally used. Since this dispersing agent is excellent in enhancing the dispersibility of pigments and in its effects to prevent the re-flocculation of pigments after the dispersion thereof, when this dispersing agent is used for dispersing pigments in a transparent resin and in an organic solvent in the preparation of the colored composition, it would be possible to obtain a color filter which is excellent in transparency. This pigment-dispersing agent can be used at a ratio of 0.1-40 parts by weight, preferably 0.1-30 parts by weight based on 100 parts by weight of the pigment in a colored composition.

As for this surfactant, it is possible to employ an anionic surfactant such as polyoxyethylene alkylether sulfate, dodecylbenzene sodium sulfonate, alkali salts of styrene-acrylic acid copolymer, alkylnaphthaline sodium sulfonate, alkyldiphenyl ether sodium disulfonate, monoethanol amine lauryl sulfate, triethanol amine lauryl sulfate, ammonium lauryl sulfate, monoethanol amine stearate, sodium stearate, sodium lauryl sulfate, monoethanol amine of styrene-acrylic acid copolymer, polyoxyethylene alkylether phosphate, etc.; a nonionic surfactant such as polyoxyethylene oleyl ether, polyoxyethylene lauryl ether, polyoxyethylene nonylphenyl ether, polyoxyethylene alkylether phosphate, polyoxyethylene sorbitan monostearate, polyethyleneglycol monolaurate, etc.; cationic surfactant such as alkyl quaternary ammonium salt and an ethylene oxide adduct thereof, etc.; and an amphoteric surfactant such as alkyl betaine such as betaine alkyldimethyl aminoacetate, alkylimidazoline, etc. Further, it is also possible to employ fluorine-based or silicone-based surfactants.

The resin type pigment dispersing agent is formed of a resin having not only a pigment affinity moiety exhibiting pigment-adsorbing properties, but also a moiety exhibiting compatibility to the monomer having an ethylenic unsaturated double bond and to the transparent resin, thereby enabling the dispersing agent to adsorb onto the pigment and to stabilize the dispersion of the pigment in the monomer having an ethylenic unsaturated double bond. As for specific examples of the resin type pigment dispersing agent, they include polyurethane, polycarboxylate such as polyacrylate, unsaturated polyamide, polycarboxylic acid, (partial) amine polycarboxylate, ammonium polycarboxylate, alkyl amine polycarboxylate, polysiloxane, long chain polyaminoamide phosphate, hydroxyl group-containing polycarboxylate and modified compounds thereof, an oily dispersing agent such as an amide formed through a reaction between poly(lower alkyl imine) and polyester having a free carboxyl group and salts of the amide, (metha)acrylic acid-styrene copolymer, (metha) acrylic acid-(metha)acrylate copolymer, styrene-maleic acid copolymer, polyvinyl alcohol, water-soluble resin or water-soluble macromolecular compound such as poly(vinyl pyrrolidone), polyester compounds, modified polyacrylate compounds, ethylene oxide/propylene oxide adduct, phosphate, etc. These compounds may be employed individually or in combination of two or more kinds.

This resin type pigment dispersing agent is available on the market, examples thereof including Disperbyk-101, 103, 107, 108, 110, 111, 116, 130, 140, 154, 161, 162, 163, 164, 165, 166, 170, 171, 174, 180, 181, 182, 183, 184, 185, 190, 2000, 2001; Anti-Terra-U, 203, 204; or BYK-P104, P104S, 220S; or Lactimon, Lactimon-WS or Bykumen (all available from BigChemy Co., Ltd.); SOLSPERSE-3000, 9000, 13240, 13650, 13940, 17000, 18000, 20000, 21000, 24000, 26000, 27000, 28000, 31845, 32000, 32500, 32600, 34750, 36600, 38500, 41000, 41090, 53095 (all available from Nippon Lubrizole Co., Ltd.); EFKA-46, 47, 48, 452, LP4008, 4009, LP4010, LP4050, LP4055, 400, 401, 402, 403, 450, 451, 453, 4550, LP4560, 120, 150, 1501, 1502, 1503 (all available from Efca Chemicals Co., Ltd.).

The pigment derivative is a compound formed of an organic pigment having a substituent group introduced therein. This organic pigment includes aromatic polycyclic compounds exhibiting a light yellow color such as naphthalene-based compounds, and anthraquinone-based compounds which are generally not referred to as pigments. As for specific examples of the pigment derivatives, it is possible to employ those described in JP-A 63-305173, JP 57-15620, JP 59-40172, JP 63-17102 and JP 9469. These pigment derivatives may be employed individually or in combination of two or more kinds.

The colored compositions according to the first and second embodiments of the present invention can be prepared as described below.

(Preparation of Colored Compositions)

In the preparation of the colored composition, by making use of various kinds of dispersing device such as a triple roll mill, a twin-roll mill, a sand mill, a kneader, a dissolver, a high-speed mixer, a homogenizer, an attritor, etc., a pigment is finely dispersed, if required together with any of the aforementioned dispersing agents, in a monomer having an ethylenic unsaturated double bond and, if required, in a transparent resin and an organic solvent to obtain a mixture to which a photo-polymerization initiator is added to obtain the colored composition. With respect to the manufacture of the colored composition for color filter containing two or more kinds of pigments, the pigments are individually finely dispersed in a monomer having an ethylenic unsaturated double bond and then the dispersions thus obtained are mixed together.

The color composition may preferably be formulated such that bulky particles 5 μm or more in size, preferably, bulky particles 1 μm or more in size, more preferably, bulky particles 0.5 μm or more in size as well as dust intermingled therein are completely removed from the composition by making use of any suitable means such as centrifugal separation, sintered filter, membrane filter, etc.

Next, the method of manufacturing a color filter according to the fourth embodiment of the present invention by making use of the colored compositions prepared as described above will be explained.

The method of manufacturing a color filter according to the fourth embodiment of the present invention is featured in that it includes the steps of: coating a substrate with the aforementioned colored composition to form a colored coated film; irradiating a filter segment-forming region or a black matrix-forming region of the colored coated film with an excimer laser beam having a wavelength of 308 nm (XeCL) at a dosage sufficient to achieve a cumulative light exposure of 1-150 mJ/cm$^2$, thereby curing the irradiated region; removing uncured portions of the colored coated film to form the filter segment or the black matrix; and repeating the above-described steps plural times while changing the kind of the colored composition, thereby forming filter segments of at least two colors and/or a black matrix.

The color filter to be manufactured by the method of this fourth embodiment is provided with filter segments and a black matrix on a substrate. For example, this color filter may be provided with a black matrix and filter segments of at least two colors selected from red, green, blue, yellow, orange and violet.

(Colored Coated Film-Forming Step)

In the colored coated film-forming step, a colored composition of the present invention is coated by means of a spin coating method or a die coating method, and then, if required, any excess solvent is removed to form a colored coated film.

With respect to the substrate for the color filter, it is possible to employ a glass plate which is high in transmittance to visible light such as soda-lime glass, low alkali borosilicate glass, alkali-free aluminoborosilicate glass, etc. or to employ a resin plate formed of a material such as polycarbonate, poly(methyl methacrylate), polyethylene terephthalate, etc. For the purpose of driving the liquid crystal after the fabrication of a liquid crystal display panel, a transparent electrode consisting of indium oxide or tin oxide may be formed on the surface of the glass plate or resin plate.

(Exposure/Curing Step)

In the exposure/curing step, a filter segment-forming region or a black matrix-forming region of the colored coated film is irradiated with an excimer laser beam having a wavelength of 308 nm (XeCL) at a dosage sufficient to achieve a cumulative light exposure of 1-150 mJ/cm$^2$. More specifically, the colored coated film formed on a substrate is irradiated with the excimer laser beam through a photomask which is smaller in size than that of the substrate, thereby curing the portions for constituting the filter segment-forming region or a black matrix-forming region of the colored coated film.

The excimer laser is an apparatus which is designed to emit a laser beam by making use of a mixed gas of a rare gas such as argon, krypton, xenon, etc. and a halogen gas such as fluorine, chlorine, etc. Depending on the combination of the kinds of gases contained in this mixed gas, the oscillation wavelength is caused to vary as represented by 193 nm (ArF), 248 nm (KrF), 308 nm (XeCL), 351 nm (XeF), etc. In the present invention, an excimer laser beam having a wavelength of 308 nm (XeCL) is employed. This excimer laser is featured in that the pulse width of the beam thereof is several ten ns, that the cross-section of the beam thereof is enabled to reflect the configuration of the discharge region and that it is capable of oscillating a rectangular beam at a high output. There is also known an excimer laser which is capable of outputting a thick beam and a large pulse energy of as large as several thousand mJ. The excimer laser is more suited for use in a technical field where a relatively large surface area is subjected to batch processing or working by making use of a high irradiation intensity rather than in a technical field where the laser beam is required to be concentrated at one spot in a working process, so that the excimer laser is generally employed in the field of laser working.

Further, the excimer laser is a kind of laser which utilizes the beam emitted from an excimer molecule which is permitted to exist for a very short period of time on the occasion where a mixed gas is being excited, so that the ground level of excimer is retained in a state of dissociation. For this reason, the molecular ground density is always zero, thus exhibiting a very excellent laser medium, thereby enabling the excimer laser to create pixels excellent in surface morphology.

As described above, the excimer laser is a very excellent laser medium which makes it possible to create the filter segments or a black matrix excellent in surface morphology within a time period of as short as several ten ns. However, the excimer laser is required to be well matched with the composition to be cured. For example, depending on the kind of combination of components constituting the composition comprising a pigment, a monomer having an ethylenic unsaturated double bond, and a photo-polymerization initiator, the monomer having an ethylenic unsaturated double bond and existing on the surface of colored coated film to be irradiated with the excimer laser beam may be caused to instantaneously cure, thereby giving rise to the generation of wrinkling on the surface of coated film due to a difference in curing reaction velocity between the surface and the interior of the coated film.

In the case of the α-hydroxyketone-based photo-polymerization initiators having 2-4 hydroxyl groups to be employed in this embodiment, it is possible to realize a mild radical-generating reaction in the exposure thereof to the excimer laser beam, so that it is possible to minimize the difference in curing reaction speed between the surface and the interior of the coated film. Therefore, the α-hydroxyketone-based photo-polymerization initiators are effective in suppressing the generation of wrinkling.

The pulse energy range of the excimer laser to be employed in this embodiment is confined to 1-150 $mJ/cm^2$, so that a colored coated film is irradiated with the excimer laser beam only once or several times so as to achieve a cumulative light exposure of 1-150 $mJ/cm^2$. It is essential that the colored coated film is cured through the application of such a weak energy as to avoid the decomposition of the film. If the cumulative light exposure exceeds 150 $mJ/cm^2$, the decomposition of the colored coated film may be caused to proceed due to the ablation phenomenon, ultimately failing to obtain filter segments or a black matrix having a sufficient film thickness. On the other hand, as long as the excimer laser is well matched with the colored composition, it is possible to form a desired film with a low level of cumulative light exposure of 1 $mJ/cm^2$. The pulse energy range of the excimer laser may preferably be confined to 1-50 $mJ/cm^2$, more preferably to 1-35 $mJ/cm^2$. The irradiation of the excimer laser beam plural times by dividing a total pulse energy into the range of 4-25 $mJ/cm^2$ may sometimes gives better results for certain kinds of the colored coated film composition.

(Uncured Portion-Removing Step)

In the step of removing an uncured portion, the uncured portion of the colored coated film is removed to create filter segments or a black matrix. As for the developing solution to be employed on the occasion of removing the uncured portion, it is possible to employ an aqueous solution of sodium carbonate, sodium hydroxide, etc. or to employ an organic alkaline solution such as dimethylbenzyl amine, triethanol amine, etc. Further, if required, the developing solution may contain a defoaming agent or a surfactant.

As for the method of developing treatment, it is possible to employ a shower developing method, a spray developing method, a dip developing method, a paddle developing method, etc.

EXAMPLES

Next, the present invention will be explained in detail with reference to specific examples and comparative examples, which are not intended to limit the scope of the present invention.

Incidentally, "part(s)" and "%" mentioned in examples and comparative examples means "part(s) by weight" and "% by weight", respectively.

First of all, the preparation of a non-photosensitive acrylic resin solution 1, a non-photosensitive acrylic resin solution 2, a photosensitive acrylic resin solution and a pigment dispersion, which were employed in the following Examples and Comparative Examples will be explained. The molecular weight of the resin was a weight average molecular weight reduced as polystyrene and measured by means of GPC (gel permeation chromatography).

(Preparation of Acrylic Resin Solution 1)

800 parts of cyclohexanone was put into a reaction vessel and heated at a temperature of 100° C. while introducing nitrogen gas into the reaction vessel and then, while maintaining this temperature, a mixture of 60.0 parts of 2-hydroxyethyl methacrylate, 60.0 parts of methacrylic acid, 65.0 parts of methyl methacrylate, 65.0 parts of butyl methacrylate and 10.0 parts of azobis-isobutyronitrile was added dropwise to the cyclohexanone over one hour, thereby allowing a polymerization reaction to take place.

After finishing the addition of the aforementioned mixture, the reaction of this mixture was further allowed to take place for 3 hours at a temperature of 100° C. Thereafter, a solution consisting of 2.0 parts of azobis-isobutyronitrile and 50 parts of cyclohexanone was added to the reaction mixture and the reaction thereof was continued for one hour at a temperature of 100° C. to obtain a solution of acrylic resin. The weight average molecular weight of this acrylic resin was about 40,000.

After being cooled down to room temperature, about 2 g of this resin solution was sampled out and thermally dried for 20 minutes at 180° C. to measure nonvolatile matter. Based on this measured results, a suitable amount of cyclohexanone was added to the resin solution that had been synthesized in advance so as to cause the ratio of the nonvolatile matter to become 20%, thus preparing the acrylic resin solution 1.

(Preparation of Non-Photosensitive Acrylic Resin Solution 2)

370 parts of cyclohexanone was put into a reaction vessel and heated at a temperature of 80° C. while introducing nitrogen gas into the reaction vessel and then, while maintaining this temperature, a mixture of 20.0 parts of methacrylic acid, 10.0 parts of methyl methacrylate, 55.0 parts n-butyl methacrylate, 15.0 parts of 2-hydroxyethyl methacrylate and 4.0 parts of 2,2'-azobis-isobutyronitrile was added dropwise to the cyclohexanone over one hour, thereby allowing a polymerization reaction to take place. After finishing the addition of the aforementioned mixture, the reaction of this mixture was further allowed to take place for 3 hours at a temperature of 80° C. Thereafter, a solution consisting of 1.0 parts of azobis-isobutyronitrile and 50 parts of cyclohexanone was added to the reaction mixture and the reaction thereof was further continued for one hour at a temperature of 80° C. to obtain a solution of non-photosensitive acrylic resin.

After being cooled down to room temperature, about 2 g of this non-photosensitive acrylic resin solution was sampled out and thermally dried for 20 minutes at 180° C. to measure nonvolatile matter. Based on this measured results, a suitable amount of cyclohexanone was added to the non-photosensitive acrylic resin solution that had been synthesized in advance so as to cause the ratio of the nonvolatile matter to become 20%, thus preparing the non-photosensitive acrylic resin solution 2. The weight average molecular weight "Mw" of this non-photosensitive acrylic resin was 40,000.

(Preparation of Photosensitive Acrylic Resin Solution)

520 parts of cyclohexanone was put into a reaction vessel and heated at a temperature of 80° C. while introducing nitrogen gas into the reaction vessel and then, while maintaining this temperature, a mixture of 7.0 parts of methacrylic acid, 7.0 parts of methyl methacrylate, 63.0 parts of 2-hydroxyethyl methacrylate, 66.0 parts of glycerol monomethacrylate and 4.0 parts of 2,2'-azobis-isobutyronitrile was added dropwise to the cyclohexanone over one hour, thereby allowing a polymerization reaction to take place. After finishing the addition of the aforementioned mixture, the reaction of this mixture was further allowed to take place for 3 hours at a temperature of 80° C. Thereafter, a solution consisting of 1.0 parts of azobis-isobutyronitrile and 70 parts of cyclohexanone was added to the reaction mixture and the reaction thereof was further continued for one hour at a temperature of 80° C. to obtain a solution of photosensitive acrylic resin.

A mixture of 56.0 parts of 2-methacryl ethyl isocyanate, 0.4 part of dibutyl tin laurate and 220.0 parts of cyclohexanone was added drop-wise to 220 parts of the photosensitive acrylic resin solution obtained as described above over three hours at a temperature of 70° C. to obtain a photosensitive acrylic resin solution. After being cooled down to room temperature, about 2 g of this photosensitive acrylic resin solution was sampled out and thermally dried for 20 minutes at 180° C. to measure nonvolatile matter. Based on this measured results, a suitable amount of cyclohexanone was added to the photosensitive acrylic resin solution that had been synthesized in advance so as to cause the ratio of the nonvolatile matter to become 20%, thus preparing the photosensitive acrylic resin solution. The weight average molecular weight "Mw" of this photosensitive acrylic resin was 20,000 and the equivalent double bond thereof was 270.

(Preparation of Pigment Dispersion)

A mixture having a composition shown in the following Table 1 was homogeneously stirred and then, by making use of a sand mill using glass beads having a diameter of 1 mm, the dispersion of the components of the composition was performed for 5 hours and the resultant product was subjected to filtration by making use of a 5 μm aperture filter to obtain a red pigment dispersion R-1, a green pigment dispersion G-1, a blue pigment dispersion B-1 and a black pigment dispersion BM-1, respectively.

TABLE 1

|  | Pigment dispersion R-1 | Pigment dispersion G-1 | Pigment dispersion B-1 | Pigment dispersion BM-1 |
|---|---|---|---|---|
| PR254 | 9.95 | — | — | — |
| PR177 | 1.58 | — | — | — |
| PG36 | — | 7.82 | — | — |
| PB15:6 | — | — | 12.0 | — |
| PY150 | 0.47 | 4.18 | — | — |
| CB | — | — | — | 12.0 |
| Pigment dispersant | 2.40 | 2.40 | 2.40 | 2.40 |
| Acrylic resin solution | 25.6 | 25.6 | 25.6 | 25.6 |
| Organic solvent | 60.0 | 60.0 | 60.0 | 60.0 |
| Total | 100.0 | 100.0 | 100.0 | 100.0 |

PR254: Diketopyrrolopyrrole-based pigment (C.I. Pigment Red 254)("IRGAPHOR RED B-CF"; Ciba-Japan Co., Ltd.).
PR177: Anthraquinone-based pigment (C.I. Pigment Red 177)("CROMOPHTAL RED A2B"; Ciba-Japan Co., Ltd.).
PG36: Halogenated copper phthalocyanine-based pigment (C.I. Pigment Green 36)("LYONOL GREEN 6YK"; Toyo Ink Manufacturing Co., Ltd.).
PB15:6: ε type copper phthalocyanine-based pigment (C.I. Pigment Blue 15:6) ("Heliogen Blue-L-6700F"; BASF Co., Ltd.).
PY150: Nickel/azo complex-based pigment (C.I. Pigment Yellow 150) ("E4GN"; Lancces Co., Ltd.).
CB: Carbon black (C.I. Pigment Black 7) ("MA11"; Mitsubishi Chemicals Co., Ltd.).
Pigment dispersant: "Solsperse 20000"; Nippon Lubrisol Co., Ltd.)
Acrylic resin solution: Acrylic resin solution 1 prepared as described above.
Solvent: Cyclohexanone Examples 1-22 and Comparative Examples 1-4

Each of the mixtures having the following formulation shown in the following Tables 4, 5 and 6, each including the pigment dispersions R-1, G-1, B-1 and BM-1 prepared in advance as shown in the above Table 1, was homogeneously stirred and each of the resultant mixtures was subjected to filtration by making use of a 1 μm aperture filter to obtain each of the colored compositions.

The formulation of each of the colored compositions is shown in the following Table 2. Further, the molar absorption coefficient at a wavelength of 308 nm ($\epsilon_{308}$) as well as the molar absorption coefficient at a wavelength of 365 nm ($\epsilon_{365}$) of the photo-polymerization initiators 1-8 each used in Examples 1-22 and Comparative Examples 1-4 is shown in the following Table 3.

TABLE 2

|  | Formulation 1R | Formulation 1G | Formulation 2G | Formulation 3G | Formulation 1B |
|---|---|---|---|---|---|
| Pigment dispersion (kind) | R-1 | G-1 | G-1 | G-1 | B-1 |
| Pigment dispersion (parts by wt) | 38.0 | 38.0 | 38.0 | 38.0 | 38.0 |
| Acrylic resin solution | 140 | 14.0 | 14.0 | 14.0 | 14.0 |
| Photo-polymerization initiator | 1.30 | 1.30 | 1.30 | 1.30 | 1.30 |
| Monomer (M-402) | 4.50 | 4.50 | 2.25 | — | 4.50 |
| Monomer (TO-1382) | — | — | 2.25 | 4.5 | — |
| Organic solvent | 42.2 | 42.2 | 42.2 | 42.2 | 42.2 |
| Total | 100.0 | 100.0 | 100.0 | 100.0 | 100.0 |
| Photo-polymerization initiator/monomer | 0.29 | 0.29 | 0.29 | 0.29 | 0.29 |

TABLE 2-continued

|  | Formulation 1BM | Formulation 2R | Formulation 3R | Formulation 4R |
|---|---|---|---|---|
| Pigment dispersion (kind) | B-1 | R-1 | R-1 | R-1 |
| Pigment dispersion (parts by wt) | 38.0 | 57.0 | 38.0 | 38.0 |
| Acrylic resin solution | 14.0 | 9.1 | 14.0 | 14.0 |
| Photo-polymerization initiator | 1.30 | 1.95 | 0.65 | 0.06 |
| Monomer (M-402) | 4.50 | 6.75 | 5.15 | 5.74 |
| Monomer (TO-1382) | — | — | — | — |
| Organic solvent | 42.2 | 25.2 | 42.2 | 42.2 |
| Total | 100.0 | 100.0 | 100.0 | 100.0 |
| Photo-polymerization initiator/monomer | 0.29 | 0.29 | 0.13 | 0.01 |

Pigment dispersion: Pigment dispersion prepared as described above.
Acrylic resin solution: Acrylic resin solution 1 prepared as described above.
Photo-polymerization initiator: Those shown in the following Table 3.
Monomer 1: Dipentaerythritol hexaacrylate ("Aronix M-402"; Tohwa Gosei Co., Ltd.)
Monomer 2: Carboxyl group-containing polyfunctional acrylate ("TO-1382"; Tohwa Gosei Co., Ltd.).
Organic solvent: Cyclohexane.

TABLE 3

|  | Molar absorption coefficient ($\epsilon_{308}$) | Molar absorption coefficient ($\epsilon_{365}$) |
|---|---|---|
| Initiator 1 | $1.49 \times 10^4$ | $0.23 \times 10^4$ |
| Initiator 2 | $1.09 \times 10^4$ | $0.27 \times 10^4$ |
| Initiator 3 | $1.72 \times 10^4$ | $0.28 \times 10^4$ |
| Initiator 4 | $0.55 \times 10^4$ | $0.14 \times 10^4$ |
| Initiator 5 | $1.93 \times 10^4$ | $1.01 \times 10^4$ |
| Initiator 6 | $1.82 \times 10^4$ | $0.11 \times 10^4$ |
| Initiator 7 | $2.18 \times 10^4$ | $2.39 \times 10^4$ |
| Initiator 8 | $0.08 \times 10^4$ | $0.01 \times 10^4$ |

Initiator 1: Carbazole-based photo-polymerization initiator; 3,6-bis(2-methyl-2-morpholinopropionyl)-9-n-octylcarbazole ("Adeca Arcles N-1414"; Asahi Denka Industries Co., Ltd.)
Initiator 2: Oxime ester-based photo-polymerization initiator; 1,2-octadione-1-[4-(phenylthio)-2-(O-benzoyloxime)] ("IRGACURE OXE-01"; Ciba-Japan Co., Ltd.)
Initiator 3: Oxime ester-based photo-polymerization initiator; ethanone,1-[9-ethyl-6-(2-methylbenzoyl)-9H-carbazol-3-yl]-,1-(O-acetyloxime) ("IRGACURE OXE-02"; Ciba-Japan Co., Ltd.)
Initiator 4: Acylphosphine oxide-based photo-polymerization initiator; 2,4,6-trimethylbenzoyl-diphenylphosphine oxide ("LUCYRIN TPO"; BASF Co., Ltd.)
Initiator 5: α-aminoalkylphenone-based photo-polymerization initiator; 2-methyl-1-[4-(methylthio)phenyl]-2-morpholinopropan-1-one ("IRGACURE 907"; Ciba-Japan Co., Ltd.)
Initiator 6: α-aminoalkylphenone-based photo-polymerization initiator; 2-(dimethylamino)-2-[4-(methyphenyl)methyl]-1-[4-(4-morpholinyl)phenyl]-1-butanone ("IRGACURE 379"; Ciba-Japan Co., Ltd.)
Initiator 7: Triazine-based photo-polymerization initiator; 9H-carbazole-9-acetic acid-3-[4,6-bis(trichloromethyl)-1,3,5-triazin-2-yl]-2-methoxy-1-methylethyl ester ("Adeca Arcles PZ-408"; Asahi Denka Industries Co., Ltd.)
Initiator 8: α-hydroxyketone-based photo-polymerization initiator; 1-[4-(2-hydroxyethoxy)phenyl]-2-hydroxy-2-methyl-1-propan-1-one ("IRGACURE 2959"; Ciba-Japan Co., Ltd.)

(Manufacture of Color Filters)

By means of spin coating, the surface of a glass substrate 10 cm×10 cm in size was coated with a red colored composition to obtain a coated film having a thickness of about 3 μm, which was then left to stand for 15 minutes in an oven at a temperature of 70° C., thereby removing any excess solvent. Then, a photomask having a stripe-like pattern was set over the coated film of the colored composition with a gap of 100 μm being interposed between the coated film and the photomask. Then, the coated film was irradiated with an excimer laser beam having a wavelength of 308 nm (XeCL) 1 to 3 times at a dosage of 4-160 mJ/cm² as shown in Tables 4 and 5. Incidentally, the excimer laser employed herein was "COMPex Pro 205" (Coherent Co., Ltd.) and the dosage of exposure was measured by making use of a device provided with 3-sigma (main body) J45LP-MUV-030 (sensor head) (Coherent Co., Ltd.). Further, by making use of a developing solution formed of a 2% aqueous solution of sodium carbonate, a spray development was performed to remove an unexposed portion of the coated film. The resultant substrate was washed with ion-exchange water and heated for 30 minutes at a temperature of 230° C., thereby forming a red filter segment having a line width of about 50 μm.

In the cases of Examples 1 and 2 and Comparative Examples 1 and 2, a green filter segment was further formed on one side of the red filter segment in the same manner as described above and, likewise, a blue filter segment was further formed on one side of the green filter segment.

A black matrix was also formed by following the same procedures as those employed in the formation of the red filter segment except that the surface of a glass substrate 10 cm×10 cm in size was coated with a black colored composition by making use of a spin coater to obtain a coated film having a thickness of about 2 μm.

(Assessment of Configuration)

With respect to the assessment of the filter segments and the black matrix of the color filters obtained in above Examples and Comparative Examples, the assessment of the linearity (1) thereof was performed by making use of an optical microscope, and the assessment of the sectional configuration (2) thereof was performed by making use of a scanning electron microscope, thus evaluating the pattern configuration in four ranks. The standard of assessment was as follows, the results being illustrated in the following Tables 4, 5 and 6.

(1) Linearity
○: Excellent in linearity
Δ: Linearity was partially poor
×: Linearity was poor
• •: Pixels were substantially not formed (2) Sectional Configuration
○: Normally tapered (trapezoidal in cross-section and the surface exposed is small)
Δ: Reversely tapered (trapezoidal in cross-section and the surface exposed is large)
•: Although pixels were created, it was difficult to judge the configuration thereof
• •: Pixels were substantially not formed (Assessment of Film Reduction Ratio)

The surface of a substrate was coated with a colored composition and left to stand for 15 minutes in an oven at a temperature of 70° C. Then, the resultant coated film was exposed to an excimer laser beam and subjected to a developing process and to a heating process which was performed for 30 minutes at 230° C. Thereafter, the film thickness of the coated film after the aforementioned exposure and the film thickness after the aforementioned heating process were measured. Then, the film reduction ratio of the coated film was calculated according to the following formula and evaluated in four ranks (⊚: Film reduction ratio was less than 20%; ○: Film reduction ratio was 20% to less than 30%; Δ: Film reduction ratio was 20% to less than 50%; •: Film reduction ratio was more than 50%). The results are illustrated in the following Tables 4, 5 and 6.

Film reduction ratio={(film thickness after the 15-minute standing at 70° C. and the exposure–film thickness after the 30-minute heating at 230° C.)/(film thickness after the 15-minute standing at 70° C. and the exposure)}×100

(Assessment of Surface Wrinkling)

The assessment of the surface wrinkling was performed on the samples of Examples 18-20. By making use of an optical microscope, the surface of the pattern of the coated film was observed and the configuration of the pattern was evaluated in three ranks. The standard of assessment was as follows, the results being illustrated in the following Table 6.

○: Wrinkling was not seen (the surface of coated film was smooth)

Δ: Wrinkling was partially seen (surface wrinkle was recognized at a peripheral portion of the surface of coated film)

×: Total wrinkling was seen (wrinkling was seen all over the surface of coated film)

TABLE 4

|  | Example 1 | | | Example 2 | | |
|---|---|---|---|---|---|---|
| Colors | Red | Green | Blue | Red | Green | Blue |
| Formulation | Formulation 1R | Formulation 1G | Formulation 1B | Formulation 1R | Formulation 1G | Formulation 1B |
| Photo-polymerization initiator | Initiator 1 | Initiator 1 | Initiator 1 | Initiator 1 | Initiator 1 | Initiator 1 |
| $1^{st}$ exposure (mJ/cm$^2$) | 20 | 20 | 20 | 4 | 4 | 4 |
| $2^{nd}$ exposure (mJ/cm$^2$) | — | — | — | — | — | — |
| $3^{rd}$ exposure (mJ/cm$^2$) | — | — | — | — | — | — |
| Linearity | ○ | ○ | ○ | ○ | ○ | ○ |
| Sectional configuration | ○ | ○ | ○ | ○ | ○ | ○ |
| Film reduction ratio | ◎ | ◎ | ◎ | ◎ | ◎ | ◎ |

|  | Example 3 | Example 4 | Example 5 | Example 6 | Example 7 |
|---|---|---|---|---|---|
| Colors | Red | Red | Red | Red | Red |
| Formulation | Formulation 1R | Formulation 1R | Formulation 1R | Formulation 1R | Formulation 1R |
| Photo-polymerization initiator | Initiator 2 | Initiator 3 | Initiator 4 | Initiator 5 | Initiator 6 |
| $1^{st}$ exposure (mJ/cm$^2$) | 20 | 20 | 20 | 20 | 20 |
| $2^{nd}$ exposure (mJ/cm$^2$) | — | — | — | — | — |
| $3^{rd}$ exposure (mJ/cm$^2$) | — | — | — | — | — |
| Linearity | ○ | ○ | ○ | ○ | ○ |
| Sectional configuration | ○ | ○ | ○ | ○ | ○ |
| Film reduction ratio | ◎ | ◎ | ◎ | ◎ | ◎ |

|  | Example 8 | Example 9 | Example 10 | Example 21 | Example 22 |
|---|---|---|---|---|---|
| Colors | Red | Red | Red | Black | Black |
| Formulation | Formulation 1R | Formulation 1R | Formulation 1R | Formulation 1BM | Formulation 1BM |
| Photo-polymerization initiator | Initiator 7 | Initiator 1 | Initiator 1 | Initiator 1 | Initiator 1 |
| $1^{st}$ exposure (mJ/cm$^2$) | 20 | 60 | 10 | 20 | 4 |
| $2^{nd}$ exposure (mJ/cm$^2$) | — | — | — | — | — |
| $3^{rd}$ exposure (mJ/cm$^2$) | — | — | — | — | — |
| Linearity | Δ | ○ | ○ | ○ | ○ |
| Sectional configuration | ○ | ○ | ○ | ○ | ○ |
| Film reduction ratio | ○ | ○ | ◎ | ◎ | ◎ |

TABLE 5

|  | Example 11 | Example 12 | Example 13 | Example 14 | Example 15 | Example 16 | Example 17 |
|---|---|---|---|---|---|---|---|
| Colors | Red | Red | Red | Red | Green | Green | Green |
| Formulation | Formulation 1R | Formulation 2R | Formulation 3R | Formulation 4R | Formulation 1G | Formulation 2G | Formulation 3G |
| Photo-polymerization initiator | Initiator 1 | Initiator 1 | Initiator 1 | Initiator 1 | Initiator 5 | Initiator 5 | Initiator 5 |
| $1^{st}$ exposure (mJ/cm$^2$) | 4 | 20 | 20 | 20 | 20 | 20 | 20 |

TABLE 5-continued

|  |  |  |  |  |  |  |  |
|---|---|---|---|---|---|---|---|
| $2^{nd}$ exposure (mJ/cm$^2$) | 4 | — | — | — | — | — | — |
| $3^{rd}$ exposure (mJ/cm$^2$) | 4 | — | — | — | — | — | — |
| Linearity | ○ | ○ | ○ | ○ | △ | ○ | ◎ |
| Sectional configuration | ○ | ○ | ○ | ○ | ○ | ◎ | ◎ |
| Film reduction ratio | ◎ | ◎ | ◎ | ◎ | ◎ | ◎ | ◎ |

|  | Comp. Ex. 1 | | | Comp. Ex. 2 | | | Comp. Ex. 3 | Comp. Ex. 4 |
|---|---|---|---|---|---|---|---|---|
| Colors | Red | Green | Blue | Red | Green | Blue | Black | Black |
| Formulation | Formulation 1R | Formulation 1G | Formulation 1B | Formulation 1R | Formulation 1G | Formulation 1B | Formulation 1BM | Formulation 1BM |
| Photo-polymerization initiator | Initiator 1 | Initiator 1 | Initiator 1 | Initiator 1 | Initiator 1 | Initiator 1 | Initiator 1 | Initiator 1 |
| $1^{st}$ exposure (mJ/cm$^2$) | 160 | 160 | 160 | 60 | 60 | 60 | 160 | 60 |
| $2^{nd}$ exposure (mJ/cm$^2$) | — | — | — | 60 | 60 | 60 | — | 60 |
| $3^{rd}$ exposure (mJ/cm$^2$) | — | — | — | 60 | 60 | 60 | — | 60 |
| Linearity | XX | XX | XX | XX | XX | XX | XX | XX |
| Sectional configuration | XX | XX | XX | XX | XX | XX | XX | XX |
| Film reduction ratio | X | X | X | X | X | X | X | X |

TABLE 6

|  | Example 18 | Example 19 | Example 20 |
|---|---|---|---|
| Colors | Blue | Blue | Blue |
| Formulation | Formulation 1B | Formulation 1B | Formulation 1B |
| Photo-polymerization initiator | Initiator 6 | Initiator 6: Initiator 8 | Initiator 6: Initiator 8 |
| Ratio of photo-polymerization initiator | 100 | 28:72 | 72:28 |
| $1^{st}$ exposure (mJ/cm$^2$) | 20 | 20 | 20 |
| $2^{nd}$ exposure (mJ/cm$^2$) | 20 | 20 | 20 |
| $3^{rd}$ exposure (mJ/cm$^2$) | — | — | — |
| Linearity | ○ | ○ | ○ |
| Sectional configuration | ○ | ○ | ○ |
| Film reduction ratio | ◎ | ○ | ◎ |
| Surface wrinkle | △ | ○ | ○ |

The following facts can be ascertained from the results shown in the above Tables 4-6.

In the cases of Examples 1 and 2, the matching among the formulation, the photo-polymerization initiator and the exposure conditions were found to be excellent, so that the results of assessment on the linearity, the cross-sectional configuration and the film reduction ratio of all of the red, green and blue filter segments were found excellent.

In the cases of Examples 3 to 7 also, the matching among the formulation, the photo-polymerization initiator and the exposure conditions were found to be excellent, thus the results of assessment on the linearity, the cross-sectional configuration and the film reduction ratio of the red filter segments were found excellent.

In the case of Example 8, a photo-polymerization initiator 7 whose molar absorption coefficient at a wavelength of 308 nm ($\epsilon_{308}$) was smaller than that at a wavelength of 365 nm ($\epsilon_{365}$) was employed. As a result, the linearity of the filter segments thereof was found partially inferior and the film reduction ratio thereof was also somewhat deteriorated, though not to a level that would be detrimental to the practical use thereof.

In the case of Example 9, since the amount of exposure of excimer laser beam was larger than that of Examples 1 to 8, the coated film was slightly destroyed and the film reduction ratio thereof was also slightly deteriorated.

Examples 10 and 11 represent a case wherein the exposure thereof to the excimer laser beam was performed by dividing a total exposure into a plurality of times, obtaining excellent results in all of these Examples.

Examples 12 to 14 represent a case wherein the concentration of pigment was relatively high and a case wherein the ratio of the photo-polymerization initiator to the monomer was relatively small, obtaining excellent results in all of these Examples.

Examples 15 to 17 represent respectively a case wherein the ratio of the carboxyl group-containing monomer was varied, finding that as the ratio of the carboxyl group-containing monomer was increased, the results obtained became proportionally better.

It was found from the comparison among Examples 18 to 20 that Examples 18 and 19 wherein the photo-polymerization initiator 8 was employed indicated improvement in the prevention of wrinkling.

In the cases of Examples 21 and 22, the matching among the formulation, the photo-polymerization initiator and the exposure conditions were found to be excellent, thus the results of assessment on the linearity, the cross-sectional configuration and the film reduction ratio of the black matrix were found to be excellent.

In the cases of Comparative Examples 1 and 3, since the amount of exposure of excimer laser beam was substantially large, the coated films of the red, green, blue and black segments were all destroyed due to the irradiation of the excimer laser beam, substantially failing to create any of the filter segments and the black matrix.

In the cases of Comparative Examples 2 and 4, although the amount of exposure of excimer laser beam to be irradiated at one time was the same as that of Example 9, the cumulative light exposure therein was larger than that of Example 9, all of the coated films of the red, green, blue and black segments were destroyed due to the irradiation of the excimer laser beam repeated three times, thus substantially failing to create any of the filter segments and the black matrix.

Examples 22-38

Each of the mixtures having the following formulation shown in the following Tables 7 and 8, each including the pigment dispersions R-1, G-1, B-1 and BM-1 prepared in advance, was homogeneously stirred and each of the resultant mixtures was subjected to filtration by making use of a 1 μm aperture filter to obtain each of the colored compositions.

TABLE 7

| | | | Resist | | | | | | | |
|---|---|---|---|---|---|---|---|---|---|---|
| | | | RR-1 | RR-2 | RR-3 | RR-4 | RR-5 | RR-6 | RR-7 | RR-8 |
| Composition | Pigment dispersion (kind) | | R-1 | R-1 | R-1 | R-1 | R-1 | R-1 | R-1 | R-1 |
| | Pigment dispersion | | 40.0 | 40.0 | 40.0 | 40.0 | 40.0 | 40.0 | 40.0 | 40.0 |
| | Transparent resin | Non-photo-sensitive transparent resin solution | 11.3 | 11.3 | 11.3 | 11.3 | 13.3 | 12.8 | 4.8 | 19.3 |
| | | Photo-sensitive transparent resin solution | 0.0 | 0.0 | 0.0 | 0.0 | 0.0 | 0.0 | 0.0 | 0.0 |
| | Photo-polymerization initiator | | 1.0 | 1.0 | 1.0 | 1.0 | 1.0 | 1.0 | 1.0 | 1.0 |
| | Polyfunctional monomer | TMPTA | 5.0 | 0.0 | 0.0 | 0.0 | 0.0 | 0.0 | 0.0 | 0.0 |
| | | PE4A | 0.0 | 5.0 | 0.0 | 0.0 | 0.0 | 0.0 | 0.0 | 0.0 |
| | | DPHA | 0.0 | 0.0 | 5.0 | 0.0 | 5.0 | 5.0 | 5.0 | 3.4 |
| | | DPPAH | 0.0 | 0.0 | 0.0 | 5.0 | 0.0 | 0.0 | 0.0 | 0.0 |
| | Polyfunctional thiol | A | 0.0 | 0.0 | 0.0 | 0.0 | 0.0 | 0.0 | 0.0 | 0.0 |
| | | B | 0.4 | 0.4 | 0.4 | 0.4 | 0.0 | 0.1 | 1.7 | 0.4 |
| | | C | 0.0 | 0.0 | 0.0 | 0.0 | 0.0 | 0.0 | 0.0 | 0.0 |
| | Organic solvent | | 42.3 | 42.3 | 42.3 | 42.3 | 40.7 | 41.1 | 47.5 | 35.9 |
| | Total | | 100.0 | 100.0 | 100.0 | 100.0 | 100.0 | 100.0 | 100.0 | 100.0 |
| | Amount of thiol (based on solid matter) | | 2.4% | 2.4% | 2.4% | 2.4% | 0.0% | 0.6% | 10.3% | 2.4% |
| | M/P | | 1.16 | 1.16 | 1.16 | 1.16 | 1.06 | 1.09 | 1.66 | 0.58 |
| | I/M | | 0.20 | 0.20 | 0.20 | 0.20 | 0.20 | 0.20 | 0.20 | 0.29 |

| | | | Resist | | | | | | |
|---|---|---|---|---|---|---|---|---|---|
| | | | RR-9 | RR-10 | RR-11 | RR-12 | RR-13 | RR-14 | RR-15 |
| Composition | Pigment dispersion (kind) | | R-1 | R-1 | R-1 | R-1 | R-1 | R-1 | R-1 |
| | Pigment dispersion | | 40.0 | 40.0 | 40.0 | 40.0 | 40.0 | 40.0 | 40.0 |
| | Transparent resin | Non-photo-sensitive transparent resin solution | 4.8 | 12.8 | 11.8 | 0.0 | 0.0 | 11.3 | 11.3 |
| | | Photo-sensitive transparent resin solution | 0.0 | 0.0 | 0.0 | 11.3 | 12.8 | 0.0 | 0.0 |
| | Photo-polymerization initiator | | 1.0 | 0.2 | 1.9 | 1.0 | 1.0 | 1.0 | 1.0 |
| | Polyfunctional monomer | TMPTA | 0.0 | 0.0 | 0.0 | 0.0 | 0.0 | 0.0 | 0.0 |
| | | PE4A | 0.0 | 0.0 | 0.0 | 5.0 | 0.0 | 0.0 | 0.0 |
| | | DPHA | 6.3 | 5.5 | 4.0 | 0.0 | 5.0 | 5.0 | 5.0 |
| | | DPPAH | 0.0 | 0.0 | 0.0 | 0.0 | 0.0 | 0.0 | 0.0 |
| | Polyfunctional thiol | A | 0.0 | 0.0 | 0.0 | 0.0 | 0.0 | 0.4 | 0.0 |
| | | B | 0.4 | 0.4 | 0.4 | 0.4 | 0.1 | 0.0 | 0.0 |
| | | C | 0.0 | 0.0 | 0.0 | 0.0 | 0.0 | 0.0 | 0.4 |
| | Organic solvent | | 47.5 | 41.1 | 41.9 | 42.3 | 41.1 | 42.3 | 42.3 |
| | Total | | 100.0 | 100.0 | 100.0 | 100.0 | 100.0 | 100.0 | 100.0 |
| | Amount of thiol (based on solid matter) | | 2.4% | 2.4% | 2.4% | 2.4% | 0.6% | 2.4% | 2.4% |
| | M/P | | 2.09 | 1.19 | 0.91 | 1.16 | 1.09 | 1.16 | 1.16 |
| | I/M | | 0.16 | 0.04 | 0.48 | 0.20 | 0.20 | 0.20 | 0.20 |

M/P: The ratio of the weight (M) of the polyfunctional monomer having at least four ethylenic unsaturated double bonds to the weight (P) of the transparent resin;
I/M: The ratio of the weight (I) of the photo-polymerization initiator to the weight (M) of the polyfunctional monomer having at least four ethylenic unsaturated double bonds.

TABLE 8

| | | | Resist | | | | | | | | |
|---|---|---|---|---|---|---|---|---|---|---|---|
| | | | GR-1 | GR-2 | GR-3 | BR-1 | BR-2 | BR-3 | BMR-1 | BMR-2 | BMR-3 |
| Composition | Pigment dispersion (kind) | | G-1 | G-1 | G-1 | B-1 | B-1 | B-1 | BM-1 | BM-1 | BM-1 |
| | Pigment dispersion | | 45.0 | 45.0 | 45.0 | 33.0 | 33.0 | 33.0 | 46.0 | 46.0 | 46.0 |
| | Transparent resin | Non-photo-sensitive transparent resin solution | 7.5 | 10.0 | 7.5 | 18.5 | 19.5 | 18.5 | 1.0 | 5.0 | 1.0 |
| | | Photo-sensitive transparent resin solution | 0.0 | 0.0 | 0.0 | 0.0 | 0.0 | 0.0 | 0.0 | 0.0 | 0.0 |
| | Photo-polymerization initiator | | 1.0 | 1.0 | 1.0 | 1.5 | 1.5 | 1.5 | 1.8 | 1.8 | 1.8 |
| | Polyfunctional monomer | TMPTA | 0.0 | 0.0 | 3.8 | 0.0 | 0.0 | 4.5 | 0.0 | 0.0 | 4.0 |
| | | PE4A | 0.0 | 0.0 | 0.0 | 0.0 | 0.0 | 0.0 | 0.0 | 0.0 | 0.0 |
| | | DPHA | 3.8 | 3.8 | 0.0 | 4.5 | 4.5 | 0.0 | 4.0 | 4.0 | 0.0 |
| | | DPPAH | 0.0 | 0.0 | 0.0 | 0.0 | 0.0 | 0.0 | 0.0 | 0.0 | 0.0 |
| | Polyfunctional thiol | A | 0.0 | 0.0 | 0.0 | 0.0 | 0.0 | 0.0 | 0.0 | 0.0 | 0.0 |
| | | B | 0.5 | 0.0 | 0.5 | 0.2 | 0.0 | 0.2 | 0.8 | 0.0 | 0.8 |
| | | C | 0.0 | 0.0 | 0.0 | 0.0 | 0.0 | 0.0 | 0.0 | 0.0 | 0.0 |
| | Organic solvent | | 42.2 | 40.2 | 42.2 | 42.3 | 41.5 | 42.3 | 46.4 | 43.2 | 46.4 |
| | Total | | 100.0 | 100.0 | 100.0 | 100.0 | 100.0 | 100.0 | 100.0 | 100.0 | 100.0 |
| | Amount of thiol (based on solid matter) | | 3.2% | 0.0% | 3.2% | 1.2% | 0.0% | 1.2% | 5.1% | 0.0% | 5.1% |
| | M/P | | 1.00 | 0.88 | 1.00 | 0.83 | 0.81 | 0.83 | 1.57 | 1.19 | 1.57 |
| | I/M | | 0.26 | 0.26 | 0.26 | 0.33 | 0.33 | 0.33 | 0.45 | 0.45 | 0.45 |

Pigment dispersion: Pigment dispersion prepared as described above.
Non-photosensitive acrylic resin solution: Non-photosensitive acrylic resin solution 2 prepared as described above.
Photosensitive acrylic resin solution: Photosensitive acrylic resin solution prepared as described above.
Photo-polymerization initiator: 2-(dimethylamino)-2-[4-(methyphenyl)methyl]-1-[4-(4-morpholinyl)phenyl]-1-butanone ("IRGACURE 379"; Ciba-Japan Co., Ltd.)
Polyfunctional monomer: Polyfunctional monomer shown in the following Table 9
Polyfunctional thiol: Polyfunctional thiol shown in the following Table 9
Organic solvent: Cyclohexane.

TABLE 9

| | Abbreviation | Compound name | Number of functional groups |
|---|---|---|---|
| Polyfunctional monomer | TMPTA | Trimethylol propane triacrylate | 3 |
| | PE4A | Pentaerythritol tetra(metha)acrylate | 4 |
| | DPHA | Dipentaerythritol hexaacrylate | 6 |
| | DPPAH | Dipentaerythritol pentaacrylate hexamethylene diisocyanate | 10 |
| Polyfunctional thiol | A | 1,4-bis(3-mercaptobutyloxy)butane | 2 |
| | B | Trimethylolpropane tris(3-mercaptobutylate) | 3 |
| | C | Pentaerythritol tetrakis(3-mercaptobutylate) | 4 |

As shown in above Table 9, while the number of functional groups of TMPTA (trimethylol propane triacrylate) is 3, the number of functional groups of all of PE4A (pentaerythritol tetra(metha)acrylate), DPHA (dipentaerythritol hexaacrylate) and DPPHA (dipentaerythritol pentaacrylate hexamethylene diisocyanate) is 4 or more and hence these polyfunctional monomers are especially preferable for use.

By following the same procedures as described above, each of the filter segments and the black matrix were formed.

Each of the colored compositions obtained in Examples 23-38 was assessed on the sensitivity thereof according to the method described below.

(Sensitivity)

The sensitivity of the colored compositions obtained in Examples 23-38 was defined on the basis of the amount of exposure which enabled to create the patterns of the filter segments or the black matrix formed from these colored compositions at the precise dimensions as planned. The results obtained are shown in the following Table 10.

⊚: Less than 30 mJ/cm$^2$
○: Not less than 30 mJ/cm$^2$ to less than 60 mJ/cm$^2$
Δ: Not less than 60 mJ/cm$^2$ to less than 100 mJ/cm$^2$
×: Not less than 100 mJ/cm$^2$ The configuration of the pattern was evaluated in four ranks according to the above-described method.

TABLE 10

| | Example 23 | Example 24 | Example 25 | Example 26 | Example 27 | Example 28 | Example 29 | Example 30 |
|---|---|---|---|---|---|---|---|---|
| Colors | Red | Red | Red | Red | Red | Red | Red | Red |
| Resist | RR-3 | RR-2 | RR-4 | RR-6 | RR-7 | RR-8 | RR-9 | RR-10 |
| Amount of thiol | 2.4% | 2.4% | 2.4% | 0.6% | 10.3% | 2.4% | 2.4% | 2.4% |
| M/P | 1.16 | 1.16 | 1.16 | 1.09 | 1.66 | 0.58 | 2.09 | 1.19 |
| I/M | 0.20 | 0.20 | 0.20 | 0.20 | 0.20 | 0.29 | 0.16 | 0.04 |

TABLE 10-continued

| | | | | | | | | |
|---|---|---|---|---|---|---|---|---|
| Sensitivity | ◉ | ○ | ◉ | Δ | ◉ | Δ | ◉ | Δ |
| Linearity | ○ | ○ | ○ | ○ | Δ | ○ | ○ | ○ |
| Sectional configuration | ○ | ○ | ○ | Δ | Δ | ○ | Δ | ○ |

| | Example 31 | Example 32 | Example 33 | Example 34 | Example 35 | Example 36 | Example 37 | Example 38 |
|---|---|---|---|---|---|---|---|---|
| Colors | Red | Red | Red | Red | Red | Green | Blue | Black |
| Resist | RR-11 | RR-12 | RR-13 | RR-14 | RR-15 | GR-1 | BR-1 | BMR-1 |
| Amount of thiol | 2.4% | 2.4% | 0.6% | 2.4% | 2.4% | 3.2% | 1.2% | 5.1% |
| M/P | 0.91 | 1.16 | 1.09 | 1.16 | 1.16 | 1.00 | 0.83 | 1.57 |
| I/M | 0.48 | 0.20 | 0.20 | 0.20 | 0.20 | 0.26 | 0.33 | 0.45 |
| Sensitivity | ◉ | ◉ | ◉ | ○ | ◉ | ◉ | ◉ | ◉ |
| Linearity | ○ | ○ | ○ | ○ | ○ | ○ | ○ | ○ |
| Sectional configuration | Δ | ○ | ○ | ○ | ○ | ○ | ○ | ○ |

*: Based on the quantity of the total solids in the colored compositions.

As shown in above Table 10, in the cases of the colored compositions each comprising a pigment, a transparent resin, a polyfunctional monomer having at least four ethylenic unsaturated double bonds, a photo-polymerization initiator and polyfunctional thiol, the sensitivities thereof were all found to be satisfactory, though the sensitivity varied slightly due to the composition thereof, thus enabling the filter segments and the black matrix to be obtained, each exhibiting a satisfactory pattern configuration in practical use.

What is claimed is:

1. A method of manufacturing a color filter, which comprises:
    coating a substrate with a colored composition including a pigment, a monomer having an ethylenic unsaturated double bond, and a photo-polymerization initiator to form a colored coated film;
    irradiating a filter segment-forming region or a black matrix-forming region of the colored coated film with an excimer laser beam having a wavelength of 308 nm (XeCL) at a dosage sufficient to achieve a cumulative light exposure of 1-150 mJ/cm² to cure the irradiated region;
    removing uncured portions of the colored coated film to form the filter segment or the black matrix; and
    repeating the above-described steps plural times while changing the kind of the colored composition to form filter segments of at least two colors and/or a black matrix.

2. The method according to claim 1, wherein the monomer having an ethylenic unsaturated double bond contains a polyfunctional (metha)acrylate having carboxyl group.

3. The method according to claim 1, wherein a ratio (I/M) of weight (I) of the photo-polymerization initiator to weight (M) of the monomer having an ethylenic unsaturated double bond is confined to a range of 0.01-0.45.

4. The method according to claim 1, wherein the colored composition comprises a pigment, a transparent resin, a polyfunctional monomer having at least four ethylenic unsaturated double bonds, a photo-polymerization Initiator and polyfunctional thiol.

5. The method according to claim 4, wherein a content of the polyfunctional thiol is confined to 0.7 wt %-10.0 wt % based on a quantity of total solids contained in the colored composition.

6. The method according to claim 4, wherein a ratio (M/P) of weight (M) of the polyfunctional monomer to weight (P) of the transparent resin is confined to a range of 0.60-2.00.

7. The method according to claim 4, wherein a ratio (I/M) of weight (I) of the photo-polymerization initiator to weight (M) of the polyfunctional monomer is confined to a range of 0.05-0.50.

8. The method according to claim 4, wherein the transparent resin is formed of two kinds of resins constituted by a non-photosensitive resin and a photosensitive resin.

9. The method according to claim 1, wherein the photo-polymerization initiator has a molar absorption coefficient at a wavelength of 308 nm($\epsilon_{308}$) larger than that at a wavelength of 365 nm ($\epsilon_{365}$).

10. The method according to claim 1, wherein the photo-polymerization initiator is at least one compound selected from the group consisting of an oxime ester-based photo-polymerization initiator, an acylphosphine oxide-based photo-polymerization initiator, an a-aminoalkyl phenone-based photo-polymerization initiator and a carbazole-based photo-polymerization initiator represented by the following general formula (1),

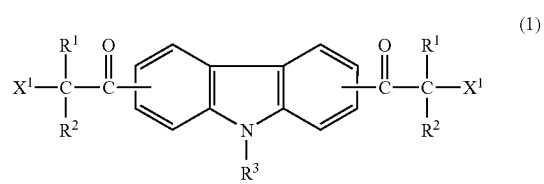

(1)

wherein $R^3$ is a hydrogen atom or an alkyl group having 1-20 carbon atoms; $R^1$ and $R^2$ are individually a hydrogen atom, an alkyl group having 1-5 carbon atoms or aryl group having 6-14 carbon atoms; and $X^1$ is a morpholino group.

11. The method according to claim 1, wherein the photo-polymerization initiator contains a first photo-polymerization initiator formed of at least one compound selected from the group consisting of an oxime ester-based photo-polymerization initiator, an acylphosphine oxide-based photo-polymerization initiator, an a-aminoalkyl phenone-based photo-polymerization initiator and a carbazole-based photo-polymerization initiator represented by the following general formula (1), and a second photo-polymerization initiator of a-hydroxyketone-based photo-polymerization initiator having 2-4 hydroxyl groups,

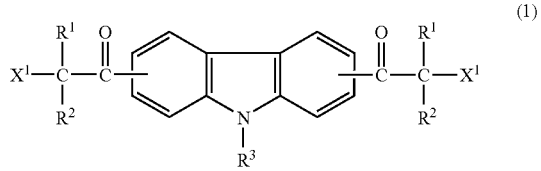 (1)

wherein $R^3$ is a hydrogen atom or an alkyl group having 1-20 carbon atoms; $R^1$ and $R^2$ are individually a hydrogen atom, an alkyl group having 1-5 carbon atoms or aryl group having 6-14 carbon atoms; and $X^1$ is a morpholino group.

12. The method according to claim 1, wherein the filter segments and/or the black matrix is formed by making use of at least two kinds of colored compositions containing the same kind of photo-polymerization initiator and representing at least two colors selected from the group consisting of red, green, blue, yellow, orange and violet.

* * * * *

UNITED STATES PATENT AND TRADEMARK OFFICE
CERTIFICATE OF CORRECTION

PATENT NO. : 8,216,750 B2
APPLICATION NO. : 12/458383
DATED : July 10, 2012
INVENTOR(S) : Isao Shigemori et al.

It is certified that error appears in the above-identified patent and that said Letters Patent is hereby corrected as shown below:

Column 29, Line 59, In Claim 4, delete "Initiator" and insert -- initiator --, therefor.
Column 30, Line 32, In Claim 10, delete "initiatoris" and insert -- initiator is --, therefor.

Signed and Sealed this
First Day of January, 2013

David J. Kappos
*Director of the United States Patent and Trademark Office*